US011239281B2

(12) United States Patent
Park

(10) Patent No.: US 11,239,281 B2
(45) Date of Patent: Feb. 1, 2022

(54) LIGHTING APPARATUS

(71) Applicant: LG Display Co., Ltd., Seoul (KR)

(72) Inventor: JoonWon Park, Seoul (KR)

(73) Assignee: LG DISPLAY CO., LTD, Seoul (KR)

( * ) Notice: Subject to any disclaimer, the term of this patent is extended or adjusted under 35 U.S.C. 154(b) by 0 days.

(21) Appl. No.: 16/726,599

(22) Filed: Dec. 24, 2019

(65) Prior Publication Data

US 2020/0212112 A1 Jul. 2, 2020

(30) Foreign Application Priority Data

Dec. 28, 2018 (KR) .................. 10-2018-0173145

(51) Int. Cl.
*H01L 27/32* (2006.01)
*H01L 51/00* (2006.01)
*H01L 51/52* (2006.01)

(52) U.S. Cl.
CPC ...... *H01L 27/3202* (2013.01); *H01L 51/0097* (2013.01); *H01L 51/5212* (2013.01); *H01L 51/5253* (2013.01); *H01L 2251/5338* (2013.01); *H01L 2251/5361* (2013.01); *H01L 2251/5392* (2013.01)

(58) Field of Classification Search
CPC ............. H01L 27/3202; H01L 51/0097; H01L 51/5212; H01L 51/5253; H01L 2251/5392; H01L 2251/5338; H01L 2251/5361; H01L 51/5206; H01L 27/3206; H01L 51/50–56; H01L 51/0032–0095; H01L 27/32–3297; H01L 2251/50–568; H01L 27/3204; H01L 33/0041; Y02E 10/549; F21K 9/20; F21V 19/001; F21V 23/02; F21Y 2115/10; B32B 2457/206
USPC ......................................................... 257/40
See application file for complete search history.

(56) References Cited

U.S. PATENT DOCUMENTS

| 9,748,512 B2 * | 8/2017 | Kim ..................... H01L 51/5228 |
| 2007/0080377 A1 * | 4/2007 | Sung ................... H01L 27/3276 257/253 |
| 2007/0197120 A1 * | 8/2007 | Lee ......................... C03C 27/10 445/25 |

(Continued)

*Primary Examiner* — Mohammad M Hoque
(74) *Attorney, Agent, or Firm* — Polsinelli PC

(57) ABSTRACT

A lighting apparatus comprising a lighting part that includes a light emitting area having a plurality of first light emitting areas that are separated apart from each other and a plurality of second light emitting areas separated apart from each other and a non-light emitting area including a first non-light emitting area surrounding the plurality of first light emitting areas and the plurality of second light emitting areas and a plurality of second non-light emitting areas extending from the first non-light emitting area, the lighting apparatus comprises a substrate; a plurality of first electrodes disposed on the substrate in the light emitting area; an organic layer disposed on the plurality of first electrodes; a second electrode disposed on the organic layer; and an encapsulation part disposed on the second electrode; wherein the plurality of first light emitting areas are arranged in a first direction, and the plurality of second light emitting areas are arranged in a second direction intersecting with the first direction, and wherein the second non-light emitting areas correspond to an area in which a plurality of patterns are included.

21 Claims, 14 Drawing Sheets

(56) References Cited

U.S. PATENT DOCUMENTS

| | | | |
|---|---|---|---|
| 2008/0165315 A1* | 7/2008 | Nishida | G02B 1/118 349/137 |
| 2011/0018416 A1* | 1/2011 | Sassa | H01L 51/529 313/45 |
| 2011/0175095 A1* | 7/2011 | Kang | H01L 27/3246 257/59 |
| 2013/0126848 A1* | 5/2013 | Harada | H01L 51/5088 257/40 |
| 2015/0008400 A1* | 1/2015 | Kim | H01L 51/56 257/40 |
| 2015/0090993 A1* | 4/2015 | Tokuda | H01L 27/3246 257/40 |
| 2015/0144917 A1* | 5/2015 | Koo | H01L 51/5246 257/40 |
| 2016/0093818 A1* | 3/2016 | Inoue | H01L 51/0085 257/40 |
| 2016/0103649 A1* | 4/2016 | Yoshitani | G09G 3/3208 345/694 |
| 2016/0218317 A1* | 7/2016 | Hong | H01L 27/3258 |
| 2017/0033166 A1* | 2/2017 | Shim | H01L 27/3279 |
| 2017/0179442 A1* | 6/2017 | Wu | C23C 14/042 |
| 2017/0213881 A1* | 7/2017 | Kondo | H01L 27/3211 |
| 2017/0271421 A1* | 9/2017 | Jinbo | H01L 51/5253 |
| 2017/0309688 A1* | 10/2017 | Lee | H01L 27/3276 |
| 2017/0330513 A1* | 11/2017 | Hong | H01L 27/3276 |
| 2018/0138441 A1* | 5/2018 | Choung | H01L 51/5092 |
| 2018/0151832 A1* | 5/2018 | Lee | H01L 51/5206 |
| 2019/0006427 A1* | 1/2019 | Lu | H01L 27/3276 |
| 2019/0035859 A1* | 1/2019 | Kang | H01L 27/3234 |
| 2019/0088904 A1* | 3/2019 | Cho | G02B 27/4205 |
| 2019/0131365 A1* | 5/2019 | Jung | H01L 51/5246 |
| 2019/0157363 A1* | 5/2019 | Lee | H01L 27/3246 |
| 2020/0212112 A1* | 7/2020 | Park | H01L 27/3202 |
| 2020/0258944 A1* | 8/2020 | Joo | H01L 27/3244 |
| 2021/0020714 A1* | 1/2021 | Lee | H01L 27/322 |

\* cited by examiner

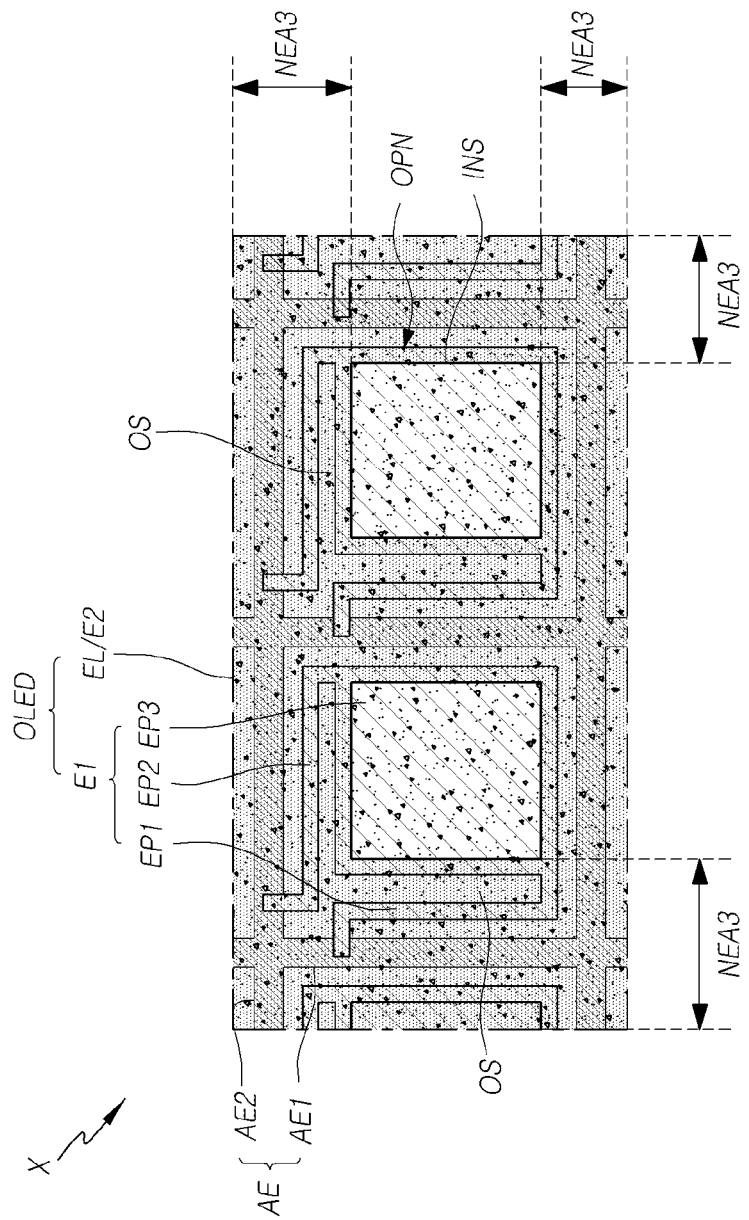

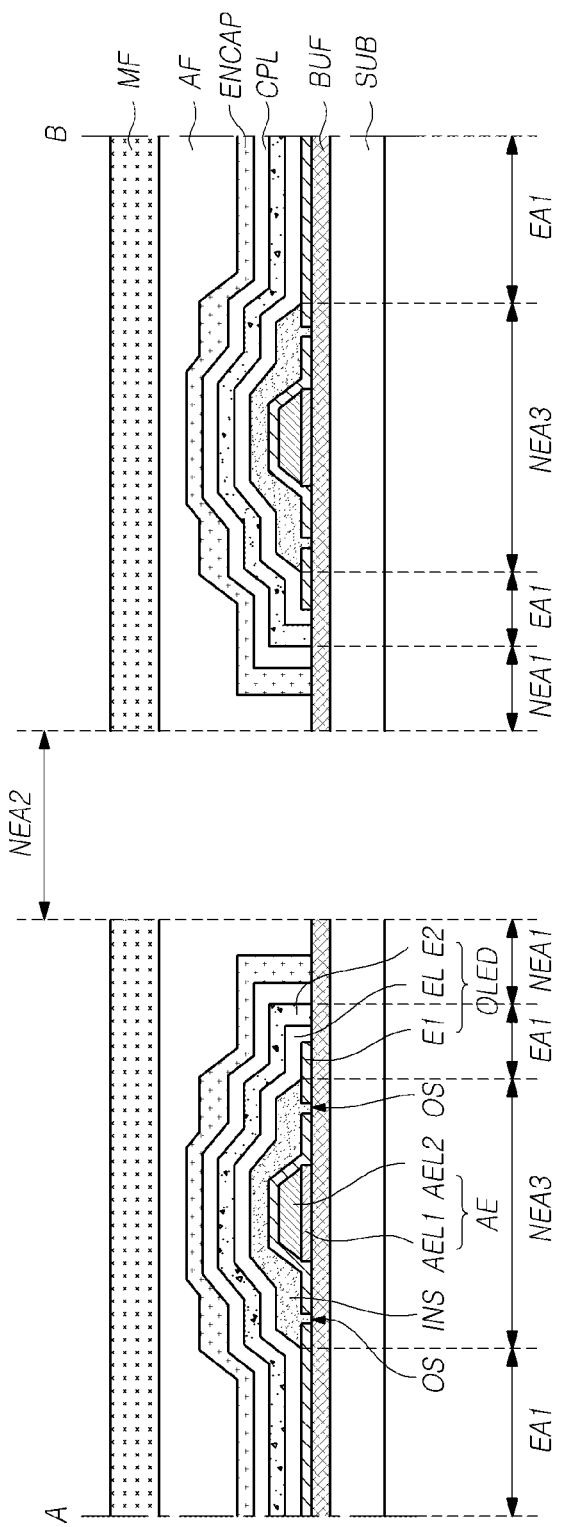

LIGHTING APPARATUS

CROSS-REFERENCE TO RELATED APPLICATION

This application claims priority from Korean Patent Application No. 10-2018-0173145 filed on Dec. 28, 2018, which is hereby incorporated by reference in its entirety.

BACKGROUND

Field of the Disclosure

The present disclosure relates to a lighting apparatus, and more particularly, to a light apparatus having extendable and contractible structures.

Description of the Background

Currently, a fluorescent lamp, an incandescent lamp, and the like are mainly used as lighting apparatuses. Among these, an incandescent lamp has a high color rendering index (CRI) and has a disadvantage of low energy efficiency. On the other hand, a fluorescent lamp has a high efficiency, has a low color rendering index, and causes an environmental problem due to containment of mercury.

The color rendering index is an index used for representing color reproduction and is an index representing a degree of similarity between color senses by comparing senses for colors of an object lighted by light sources between the case of lighting using a specific light source and the case of lighting using a reference light source. The CRI of sunlight is 100.

In order to solve such problems of conventional lighting apparatuses, recently, a light emitting diode (LED) has been proposed as a lighting apparatus. The light emitting diode is composed of inorganic light emitting materials, has the highest light emission efficiency in a wavelength band of blue and has a light emission efficiency decreasing toward a wavelength band of red and a wavelength band of green that is a color having the highest luminosity factor. Accordingly, in a case in which white light is emitted by combining a red light emitting diode, a green light emitting diode, and a blue light emitting diode, there is a disadvantage of lowering light emission efficiency.

As a counterplan, a lighting apparatus using organic light emitting devices (organic light emitting diodes (OLED)) has been developed. However, in the case of a lighting apparatus using organic light emitting devices having a large area, light emission of all the organic light emitting devices included in the lighting apparatus may not be achieved due to foreign materials. In other words, there is a problem in that a lighting apparatus using organic light emitting devices has characteristics that are very sensitive to foreign materials.

In addition, while such lighting apparatuses are designed for various uses in various forms, it is difficult to manufacture the lighting apparatuses to have uses and forms desired by users.

SUMMARY

Accordingly, the present disclosure is directed to a lighting apparatus that substantially obviates one or more of problems due to limitations and disadvantages of the prior art.

Additional features and advantages of the disclosure will be set forth in the description which follows and in part will be apparent from the description, or may be learned by practice of the invention. Other advantages of the present disclosure will be realized and attained by the structure particularly pointed out in the written description and claims hereof as well as the appended drawings.

An aspect of the present disclosure provides a lighting apparatus having an extendable and contractible structure.

Another aspect of the present disclosure provides a lighting apparatus having a structure capable of acquiring a short reduction effect.

Yet another aspect of the present disclosure provides a lighting apparatus having a structure capable of having a long life.

A further aspect of the present disclosure provides a lighting apparatus having a stretchable structure using a simple process.

According to an aspect of the present disclosure, there is provided a lighting apparatus comprising a lighting part, the lighting part including a light emitting area including a plurality of first light emitting areas that are separate from each other and a plurality of second light emitting areas separate from each other and a non-light emitting area including a first non-light emitting area surrounding the plurality of first light emitting areas and the plurality of second light emitting areas and a plurality of second non-light emitting areas extending from the first non-light emitting area, the lighting apparatus comprises a substrate; a plurality of first electrodes disposed on the substrate in the light emitting area; an organic layer disposed on the first electrodes in the light emitting area; a second electrode disposed on the organic layer in the light emitting area and is disposed to cover; and an encapsulation part disposed on the second electrode; wherein the plurality of first light emitting areas are arranged in a first direction, and the plurality of second light emitting areas are arranged in a second direction intersecting with the first direction, and wherein the second non-light emitting areas correspond to an area in which a plurality of patterns are included.

The lighting apparatus further comprises a plurality of auxiliary electrodes disposed on the substrate in the light emitting area and the first non-light emitting area, the first electrodes overlapping and connecting with the auxiliary electrodes in the light emitting area; and an insulating film overlapping a part of the first electrodes.

Each of the plurality of first light emitting areas and the plurality of second light emitting areas includes a plurality of unitary light emitting parts.

One of the plurality of first electrodes, the organic layer disposed on the first electrode and brought into contact with the first electrode, and the second electrode disposed on the organic layer may be disposed in the unitary light emitting part.

A third non-light emitting area may be disposed between the unitary light emitting part and another unitary light emitting part adjacent to the unitary light emitting part in each of the plurality of first light emitting area and the plurality of second light emitting areas.

The third non-light emitting area may correspond to an area in which the insulating film is disposed.

The insulating film may be disposed in the plurality of first light emitting areas, the plurality of second light emitting areas, and the first non-light emitting area and may be disposed in the third non-light emitting areas of the plurality of first light emitting areas and the plurality of second light emitting areas.

The plurality of second non-light emitting areas may be separate from each other.

Each of the plurality of patterns may be a hole.

In a case in which the lighting apparatus extends, a width of at least one of the plurality of patterns in a direction perpendicular to a force applied to the lighting apparatus may become zero.

In a case in which the lighting apparatus extends, a maximum value of a length by which the lighting apparatus extends may correspond to a sum of widths of the plurality of patterns.

Sizes of the plurality of patterns included in the substrate and the encapsulation part may be different from each other.

The sizes of the plurality of patterns may gradually increase or decrease from a center portion of the lighting part toward outer side of the center portion, and the plurality of patterns may be distributed more densely in the center portion of the lighting part than outer side of the center portion.

The auxiliary electrodes may include at least one opening formed by arranging a plurality of first auxiliary electrodes extending in the first direction and a plurality of second auxiliary electrodes extending in the second direction.

A part of one of the first electrodes may be disposed inside the opening of the auxiliary electrodes, and the first electrode may include an area that is in contact with the auxiliary electrodes.

A part area of the at least one opening may correspond to a unitary light emitting part.

The substrate may be a flexible substrate.

The electric resistance of the first electrode may be higher than the electric resistance of the auxiliary electrode.

The lighting apparatus may further comprise a pad part disposed on an outer side of the lighting part for applying signals to the lighting part.

The plurality of patterns may be distributed more densely in a center portion of the lighting part than outer side of the center portion.

The lighting apparatus may further comprise a plurality of auxiliary electrodes disposed on the substrate in the light emitting area and the first non-light emitting area, the first electrodes overlapping and connecting with the auxiliary electrodes in the light emitting area; and an insulating film overlapping a part of the first electrodes.

The pad part may comprise a first pad electrode extending from the auxiliary electrode and a second pad electrode extending from the first electrode and connected with the first pad electrode.

The pad part may further comprise a third pad electrode extending from the second electrode and connected with the first pad electrode.

According to aspects of the present disclosure, a lighting apparatus having an extendable and contractible structure can be provided.

According to aspects of the present disclosure, a lighting apparatus having a structure capable of acquiring a short reduction effect can be provided.

According to aspects of the present disclosure, a lighting apparatus having a structure capable of having a long life can be provided.

According to aspects of the present disclosure, a lighting apparatus having a stretchable structure using a simple process can be provided.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings:

FIG. 4A is a diagram illustrating an area X illustrated in FIG. 3 in an enlarged scale;

FIG. 5 is a cross-sectional view taken along line A-B illustrated in FIG. 3;

DETAILED DESCRIPTION OF THE DISCLOSURE

Figure 1:
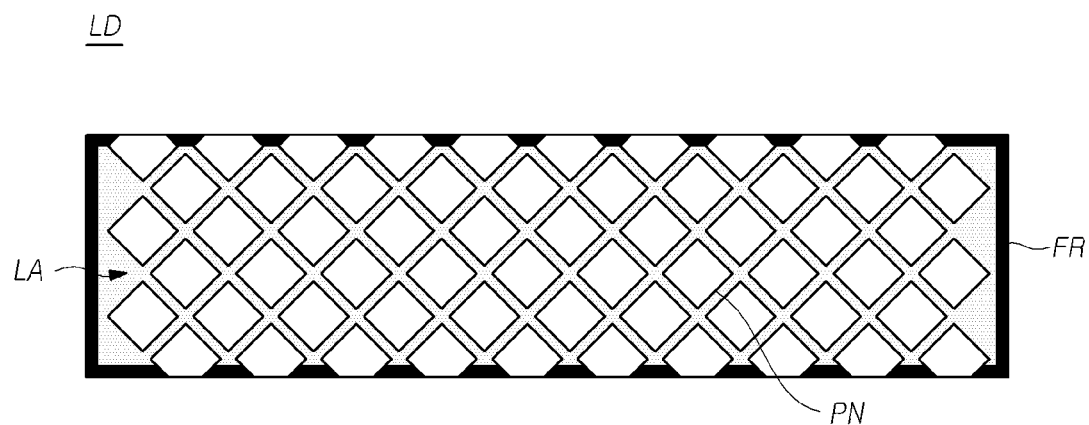
FIG. 1 is a plan view illustrating an external view of a lighting apparatus LD according to an aspect of the present disclosure.

Hereinafter, some aspects of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

Figure 2:
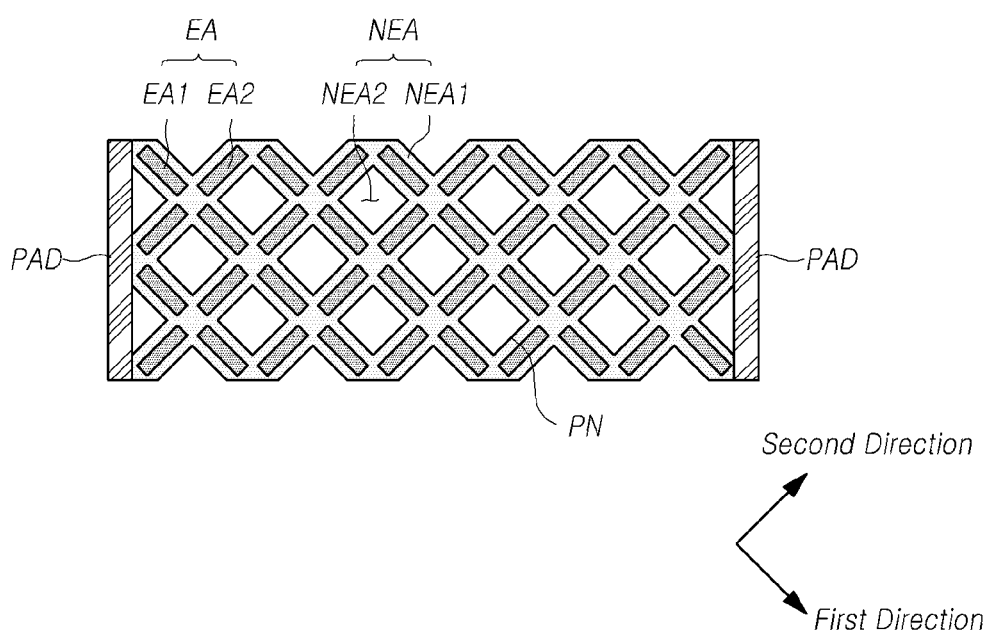
FIG. 2 is a plan view schematically illustrating a structure of a lighting apparatus LD according to an aspect of the present disclosure.

FIG. 1 is a plan view illustrating an external view of a lighting apparatus LD according to an aspect of the present disclosure. FIG. 2 is a plan view schematically illustrating a structure of a lighting apparatus LD according to an aspect of the present disclosure.

Referring to FIGS. 1 and 2, a lighting apparatus LD according to an aspect of the present disclosure may include a lighting part LA and pad parts PAD disposed on the outer sides of the lighting part LA.

The pad part PAD of the lighting apparatus LD is a non-light emitting area and may have a role of applying signals to the lighting part LA.

In addition, the pad part PAD, as illustrated in FIG. 1, is covered through a mechanism such as a frame FR or the like, and the aesthetic impression of the lighting apparatus LD can be improved.

Although not illustrated in the drawing, a plurality of electrodes may be disposed in the pad part PAD.

A part or the whole of the pad part PAD, is not covered with an encapsulation part EN illustrated in FIG. 1, and accordingly, a plurality of electrodes disposed in the pad part PAD can be electrically connected to the outside. A signal (for example, a DC voltage) can be applied to the lighting part LA through the pad part PAD.

In addition, the lighting part LA may include a light emitting area EA and a non-light emitting area NEA.

The lighting apparatus LD according to an aspect of the present disclosure may be a bottom emission type in which light generated from an organic layer EL is emitted toward a substrate SUB direction, and the aspect of the present disclosure is not limited thereto.

More specifically, as illustrated in FIG. 2, the light emitting area EA may include a plurality of first light emitting areas EA1 and a plurality of second light emitting areas EA2.

The plurality of first light emitting areas EA1 may be disposed to be separate from each other, and the first light emitting areas EA1 disposed to be separate from each other may be disposed in parallel with a first direction within the lighting part LA.

More specifically, the plurality of first light emitting areas EA1 may include a plurality of first light emitting areas EA1 disposed in a first column extending in a first direction and include a plurality of first light emitting areas EA1 disposed in a second column parallel to the first column. In other words, the plurality of first light emitting areas EA1 may include first light emitting areas EA1 disposed in a plurality of columns extending in the first direction.

The plurality of second light emitting areas EA2 may be disposed to be separate from each other, and the second light emitting areas EA2 separate from each other may be disposed in parallel with a second direction that is a direction intersecting with the first direction within the lighting part LA.

In addition, as illustrated in FIG. 2, the plurality of first light emitting areas EA1 and the plurality of second light emitting areas EA2 may be separate from each other as well.

The non-light emitting area NEA of the lighting part LA may include a first non-light emitting area NEA1 and a plurality of second non-light emitting areas NEA2.

The first non-light emitting area NEA1 may be arranged to surround the light emitting area EA. More specifically, the first non-light emitting area NEA1 may extend at a plurality of first light emitting areas EA1 and a plurality of second light emitting areas EA2 and surround the pluralities of the first and second light emitting areas EA1 and EA2.

The second non-light emitting area NEA2 may be disposed to be separate from the light emitting area EA and may be surrounded by the first non-light emitting area NEA1.

The second non-light emitting area NEA2 may be an area corresponding to an area in which a plurality of patterns PN presented in the lighting part LA is included. The plurality of patterns PN may be holes.

The plurality of patterns PN disposed in the lighting part LA may be disposed to be separate from each other. The plurality of patterns PN may be regularly disposed in the first direction or the second direction, and the present disclosure is not limited thereto.

In this way, by arranging a plurality of holes in the lighting part LA, the flexibility of the lighting apparatus LD according to an aspect of the present disclosure can be improved. For example, in a case in which the lighting apparatus LD according to an aspect of the present disclosure is pulled in one direction by applying an external force thereto, the lighting apparatus can be easily expanded in accordance with the plurality of patterns (PN).

To the contrary, in a case in which the lighting apparatus LD according to an aspect of the present disclosure is pressed in one direction by applying an external force thereto, there is an advantage of being easily bent in accordance with the plurality of patterns PN included in the lighting part LA.

Hereinafter, the structure of the lighting apparatus LD according to the present disclosure will be reviewed in more detail with reference to FIGS. 3 and 4A.

Figure 3:
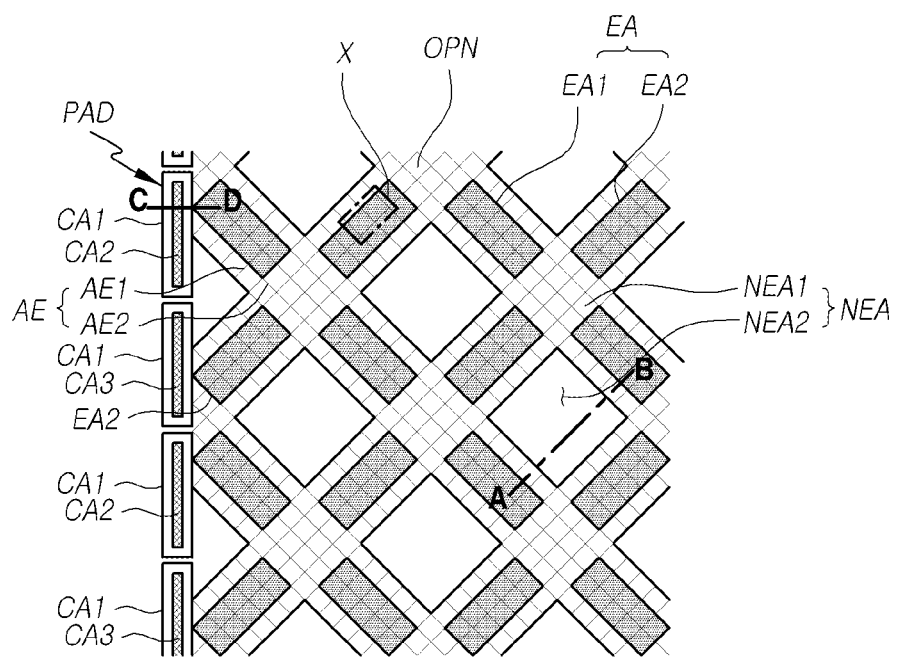
FIG. 3 is a plan view illustrating a part of a lighting apparatus according to an aspect of the present disclosure.
Figure 4B:
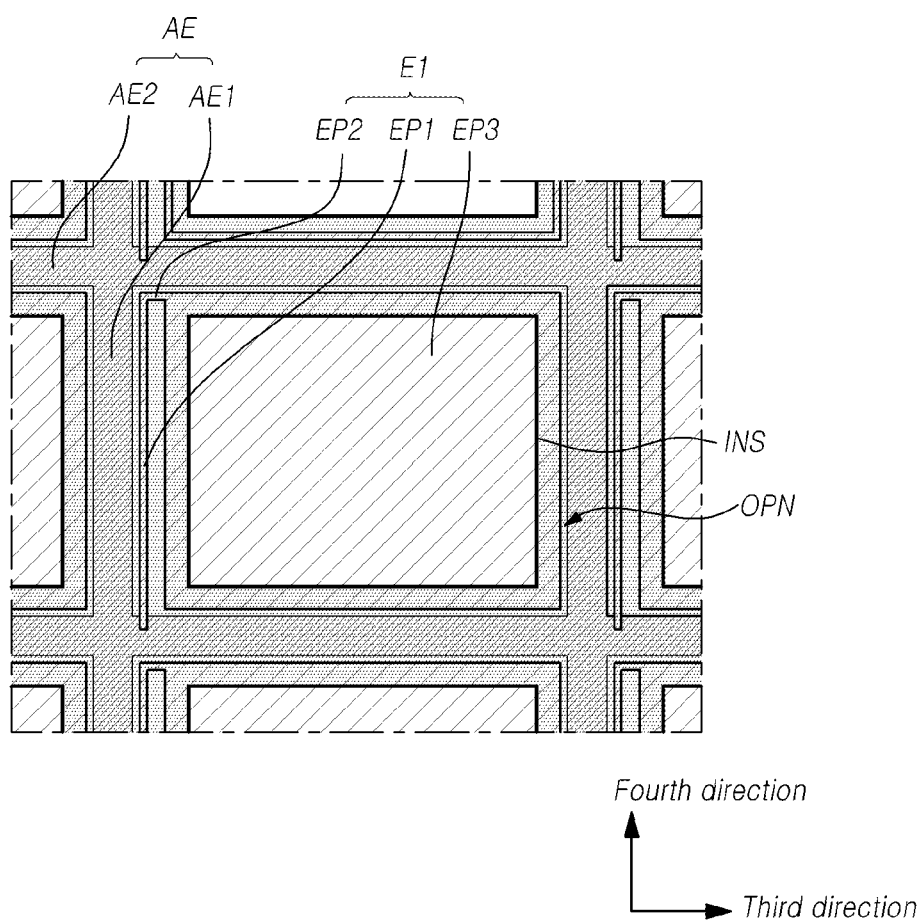
FIG. 4B is a diagram illustrating another structure of a first electrode included in a lighting apparatus according to an aspect of the present disclosure.

FIG. 3 is a plan view illustrating a part of a lighting apparatus according to an aspect of the present disclosure. FIG. 4A is a diagram illustrating an area X illustrated in FIG. 3 in an enlarged scale. FIG. 4B is a diagram illustrating another structure of a first electrode included in a lighting apparatus according to an aspect of the present disclosure.

Referring to FIGS. 3, 4A, and 4B, the lighting apparatus LD according to an aspect of the present disclosure includes a lighting part LA and pad parts PAD disposed on the outer side of the lighting part LA.

A plurality of auxiliary electrodes AE extending from the pad parts PAD may be disposed in the lighting part LA.

The plurality of auxiliary electrodes AE may be disposed in the first light emitting area EA1, the second light emitting area EA2, and the first non-light emitting area NEA1. In other words, a plurality of auxiliary electrodes AE may not be disposed in the second non-light emitting area NEA2.

The plurality of auxiliary electrodes AE may include a plurality of first auxiliary electrodes AE1 extending in a first direction and a plurality of second auxiliary electrodes AE2 extending in a second direction. Here, the plurality of first auxiliary electrodes AE1 may be disposed in parallel with each other. In addition, the plurality of second auxiliary electrodes AE2 may be disposed in parallel with each other.

The auxiliary electrodes AE are arranged in a matrix shape, a mesh shape, a hexagonal shape, an octagonal shape, a circular shape, or the like having a thin width in the lighting part LA, and a uniform current is applied to the first electrodes EA1 of organic light emitting devices (OLED) of the lighting part LA, whereby light emission having uniform luminance in a large-area lighting apparatus LD can be performed.

In an aspect of the present disclosure, a configuration in which auxiliary electrodes AE are arranged in a mesh shape will be mainly described.

The auxiliary electrode AE may include at least one opening OPN formed by arranging at least two first auxiliary electrodes AE1 and at least two second auxiliary electrodes AE2.

As illustrated in FIG. 4A, first electrodes E1 of the organic light emitting device OLED overlapping with some of the auxiliary electrodes AE may be disposed on the substrate of the lighting apparatus LD. A part of the first electrodes E1 may be connected to the auxiliary electrodes AE.

More specifically, as illustrated in FIGS. 4A and 4B, the first electrode E1 may include a first part EP1 and a second part EP2 connected to the auxiliary electrodes AE and a third part EP3 having a plate shape disposed in the opening OPN arranged by the auxiliary electrodes AE. Separation parts OS may be arranged between the first part EP1 and the third part EP3 and between the second part EP2 and the third part EP3 of the first electrode E1.

The third part EP3 of the first electrode E1 is disposed in the opening OPN and may not overlap with the auxiliary electrode AE.

The first part EP1 and the second part EP2 may be forms branching from the third part EP3. The area of the first part EP1 and the second part EP2 may be smaller than the area of the third part EP3.

In addition, as illustrated in FIG. 4A, the first part EP1 may be connected to the first auxiliary electrode AE1, and the second part EP2 may be connected to the second auxiliary electrode AE2.

Here, the first part EP1 of the first electrode E1 being connected to the first auxiliary electrode AE1 represents that the first part EP1 and the first auxiliary electrode AE1 can be electrically connected through a contact between the first part EP1 and the first auxiliary electrode AE1.

The second part EP2 of the first electrode E1 being connected to the second auxiliary electrode AE2 represents that the second part EP2 and the second auxiliary electrode AE2 can be electrically connected through a contact between the second part EP2 and the second auxiliary electrode AE2.

However, the structure of the lighting apparatus LD according to an aspect of the present disclosure is not limited thereto. For example, there may be one or three or more parts branching from the third part EP3 of the first electrode E1 and being connected to the auxiliary electrode EA. There may be one or three or more parts branching and being connected to the auxiliary electrode EA.

In addition, as illustrated in FIG. 4B, the first electrode E1 may include a first part EP1 electrically connected to the auxiliary electrode AE, a second part EP2 that is connected to the first part EP1 and extends in a direction different from a direction in which the first part EP1 extends, and a third part EP3 that is connected to the second part EP2 and has a plate shape.

More specifically, the second part EP2 may be an area that is connected to the third part EP3 and extends from the third part EP3 in a third direction, and the first part EP1 may be an area that is connected to the second part EP2 and extends from the second part EP2 in a fourth direction. Here, the fourth direction may be a direction different from the third direction.

In addition, an insulating film INS that overlaps with the auxiliary electrode AE and overlaps with a part of the first electrode E1 in the structure illustrated in FIG. 4A or 4B may be disposed.

Here, the insulating film INS may be composed of an inorganic material such as SiOx or SiNx. However, the present disclosure is not limited thereto, and the insulating film INS may be composed of an organic material such as a photo-acryl or may be composed of a plurality of layers of an inorganic material and an organic material.

The insulating film INS may be arranged to overlap with a part of the opening OPN arranged by the auxiliary electrodes AE while overlapping with the auxiliary electrode AE. Here, the insulating film INS may overlap with the first part EP1 and the second part EP2 of the first electrode E1, and, together with this, the insulating film INS may overlap with a part of the third part EP3 of the first electrode E1.

In another aspect, the insulating film INS may not overlap with a part of the third part EP3.

In this way, while the insulating film INS disposed in the lighting part LA is configured to cover the auxiliary electrode AE and the first electrode E1 disposed above the auxiliary electrode AE, the insulating film INS is not disposed in the light emitting area in which light of the organic light emitting device OLED is emitted.

Particularly, the insulating film INS of the lighting part LA is formed to surround the auxiliary electrode AE and decreases a level difference according to the auxiliary electrode AE, whereby components formed thereafter can be stably formed without being open-circuited.

The first electrode E1 of the organic light emitting device OLED described above may be disposed in the light emitting area EA. In other words, the first electrode E1 may not be disposed in the non-light emitting area NEA.

In other words, the first electrode E1 may be disposed in a plurality of first light emitting areas EA1 and a plurality of second light emitting areas EA2.

Each of one first light emitting area EA1 and one second light emitting area EA2 may include a plurality of unitary light emitting parts.

Each of the plurality of unitary light emitting parts may include one first electrode E1, an organic layer EL that is disposed on the first electrode E1 and is brought into contact with the first electrode E1, and a second electrode E2 that is disposed on the organic layer EL.

In other words, a unitary light emitting part included in a plurality of first and second light emitting areas EA1 and EA2 may overlap with a part of the opening OPN arranged by a plurality of auxiliary electrodes AE. More specifically, a unitary light emitting part included in the first and second light emitting areas EA1 and EA2 may be an area corresponding to an area in which the first electrode E1 of the organic light emitting device OLED overlapping with the opening OPN does not overlap with the insulating film INS.

Each of one first light emitting area EA1 and one second light emitting area EA2 may be an area in which a plurality of unitary light emitting parts are aggregated.

Meanwhile, in the first and second light emitting areas EA1 and EA2, a third non-light emitting area NEA3 may be present between one unitary light emitting part and another unitary light emitting part adjacent thereto.

The third non-light emitting area NEA3 may be an area corresponding to an area in which the insulating film INS is disposed.

To sum up, the insulating film INS defining the third non-light emitting area NEA3 is disposed in a plurality of first light emitting areas EA1 and a plurality of second light emitting areas EA2 and may be disposed in the third non-light emitting area NEA3 present in a plurality of first light emitting areas EA1 and a plurality of second light emitting areas EA2.

Such an insulating film INS may be disposed also in the first non-light emitting area NEA1 surrounding the light emitting area EA.

The organic layer EL and the second electrode E2 of the organic light emitting device OLED may be disposed on the substrate in which such an insulating film INS is disposed.

Meanwhile, although not illustrated in FIGS. 3 and 4A, an encapsulation part may be further disposed on the substrate in which the second electrode E2 is disposed.

Such an encapsulation part may be disposed in the lighting part LA and may not be disposed in the pad part PAD.

Meanwhile, as described above, in the lighting apparatus LD according to an aspect of the present disclosure, the pad part PAD may be disposed on the outer side of the lighting part LA including the light emitting area EA and the non-light emitting area NEA.

A plurality of pad electrodes CA1, CA2, CA3 may be disposed in the pad part PAD.

More specifically, a plurality of first pad electrodes CA1 disposed in the same layer as that of the plurality of auxiliary electrodes AE disposed in the lighting part LA may be disposed in the pad part PAD.

A part of the plurality of first pad electrodes CA1 may be disposed to be electrically connected to the second pad electrode CA2. Here, the second pad electrode CA2 may be in a state connected to the first electrode E1 of the organic light emitting device OLED disposed in the lighting part LA.

The remaining part of the plurality of first pad electrodes CA1 may be disposed to be electrically connected to the third pad electrode CA3. Here, the third pad electrode CA3 may be in a state connected to the second electrode E2 of the organic light emitting device OLED disposed in the lighting part LA.

Accordingly, signals (for example, DC voltages) can be applied to the first electrode E1 and the second electrode E2 of the organic light emitting device OLED disposed in the lighting part LA through the pad part PAD.

By applying signals to the first electrode E1 and the second electrode E2, the organic layer EL emits light, and accordingly, light can be emitted to the outside of the lighting apparatus LD through the lighting part LA.

Meanwhile, the structure of the light emitting area EA and the non-light emitting area NEA according to the present disclosure will be reviewed as below with reference to FIG. 5.

FIG. 5 is a cross-sectional view taken along line A-B illustrated in FIG. 3.

In the following description, details (configurations, effects, and the like) that are the same as those of the aspects described above may be omitted.

Referring to FIG. 5, a buffer layer BUF may be disposed on the substrate SUB. The buffer layer BUF may be disposed on the entire surface of the substrate SUB, and the present disclosure is not limited thereto.

Although the buffer layer BUF is illustrated to have a configuration of a single layer in FIG. 5, the present disclosure is not limited thereto. For example, the buffer layer BUF may be multiple layers.

An auxiliary electrode AE may be disposed on the buffer layer BUF. Here, the auxiliary electrode AE may include a first auxiliary electrode layer AEL1 and a second auxiliary electrode layer AEL2 disposed on the first auxiliary electrode layer AEL1, and the present disclosure is not limited thereto. For example, the auxiliary electrode AE may include a single layer or multiple layers of three or more layers.

The material of the first auxiliary electrode layer AEL1 and the second auxiliary electrode layer AEL2 of the auxiliary electrode AE may be one of aluminum (Al), gold (Au), copper (Cu), titanium (Ti), tungsten (W), and molybdenum (Mo), and an alloy thereof, and the present disclosure is not limited thereto.

The first electrode E1 of the organic light emitting device OLED may be disposed on the auxiliary electrode AE. The material of the first electrode E1 may be one of indium tin oxide (ITO), indium zinc oxide (IZO), and indium gallium zinc oxide (IGZO), and the present disclosure is not limited thereto.

The first electrode E1 may be brought into contact with the auxiliary electrode AE in an area in which the auxiliary electrode AE is disposed.

The first electrode E1 is formed using a transparent conductive material and has an advantage of transmitting emitted light and has a disadvantage of having electric resistance higher than that of a non-transparent metal. In other words, the electric resistance of the first electrode E1 of the organic light emitting device OLED disposed in the lighting part LA may be higher than the electric resistance of the auxiliary electrode AE.

Accordingly, in a case in which a lighting apparatus LD having a large area is manufactured, a distribution of current applied to a wide lighting area becomes uneven due to high resistance of the transparent conductive material, and such a non-uniform current distribution inhibits uniform-luminance light emission of the lighting apparatus LD having a large area.

In the present disclosure, by disposing the auxiliary electrode AE in the entire lighting part LA, a uniform current is applied to the first electrode E1 of the organic light emitting device OLED disposed in the lighting part LA, and there is an advantage of uniform luminance of the lighting part LA of the lighting apparatus LD having a large area for each position.

In addition, in a case in which a foreign material is inserted into at least one organic light emitting device OLED among a plurality of organic light emitting devices OLED disposed in the lighting part LA, a voltage is concentrated on the first electrode E1 present at a position at which the foreign material is inserted, and voltages applied to the other organic light emitting devices OLED disposed in the lighting part LA become lower than a drive voltage, and light emission of the organic light emitting devices OLED disposed in the lighting part LA may not be achieved.

However, a short reduction effect of the lighting apparatus LD can be acquired through the structure of the first electrode E1 according to an aspect of the present disclosure.

More specifically, as illustrated in FIGS. 4A and 5, each first electrode E1 of the organic light emitting device OLED disposed in the lighting part LA may be brought into contact with the auxiliary electrode AE. As described above, since the resistivity of the first electrode E1 is higher than the resistivity of the auxiliary electrode AE, the first electrode E1 connected to the auxiliary electrode AE may operate as a resistance component.

Accordingly, even in a case in which a foreign material is inserted into at least one organic light emitting device OLED among the plurality of organic light emitting devices OLED disposed in the lighting part LA, and a voltage is concentrated on the first electrode E1 that is present at a position at which the foreign material is inserted, the voltage is not different much from voltages applied to the other organic light emitting devices (OLED) disposed in the lighting part LA, and organic light emitting devices (OLED) into which a foreign material has not been inserted can emit light regardless of the organic light emitting device (OLED) into which the foreign material has been inserted.

The organic light emitting device OLED disposed in an area in which a foreign material is present has high electric resistance due to the foreign material, and a current applied to the organic light emitting device OLED decreases much, whereby the organic light emitting device OLED may not emit light.

To sum up, by bringing the first electrode E1 of the organic light emitting device OLED and the auxiliary electrode AE into contact with each other, only the organic light emitting device OLED disposed in the area in which the foreign material is present does not emit light, and there is an advantage of improving the life of the lighting apparatus.

Particularly, in the lighting apparatus LD according to an aspect of the present disclosure, there are at least two parts (the first part and the second part) branching from the third part (P3) of the first electrode E1, and accordingly, a possibility that the first electrode E1 and the auxiliary electrode AE are in contact with each other can be increased.

For example, in a case in which there is one part branching from the third part P3 of the first electrode E1 (in other words, in a case in which there is one separation part), due to a problem in the processing or the like, a possibility that a part branching from the third part P3 of the first electrode E1 is not sufficient formed or a possibility that the branching part is not sufficiently brought into contact with the auxiliary electrode AE may increase.

However, by applying a structure in which the number of parts branching from the third part P3 is two (in other words, in a case in which there are two or more separation parts; see FIG. 4A) to the lighting apparatus LD according to an aspect of the present disclosure, there is an effect of increasing a possibility that the first electrode E1 and the auxiliary electrode AE are in contact with each other.

An insulating film INS overlapping with the auxiliary electrode AE may be disposed on the first electrode E1 having such a structure.

An area in which the insulating film INS is disposed may correspond to the third non-light emitting area NEA3 included in the first light emitting area EA1 and the second light emitting area EA2. In addition, an area in which the first electrode E1 does not overlap with the insulating film INS may be a light emitting area EA.

Such an insulating film INS may not be disposed in the second non-light emitting area NEA2.

The organic layer EL of the organic light emitting device OLED may be disposed on the insulating film INS. The organic layer EL may be disposed to cover the insulating film INS and the first electrode E1.

Such an organic layer EL may be disposed in an area corresponding to the lighting part LA. In other words, since the organic layer EL is not disposed in the pad part PAD, penetration of moisture into the organic layer EL through the pad part PAD can be prevented.

Such an organic layer EL may be configured to have a tandem structure including a red light emitting layer, a blue light emitting layer, and a green light emitting layer or a blue light emitting layer and a yellow-green light emitting layer as an organic layer emitting white light.

In addition, although not illustrated in FIG. 5, the organic layer EL may include an electron injection layer and a hole injection layer respectively injecting electrons and holes into a light emitting layer, an electron transport layer and a hole transport layer respectively transporting the electrons and the holes that have been injected to the light emitting layer, and an electric charge generating layer generating electric charge such as electrons and holes.

The second electrode E2 of the organic light emitting device OLED may be disposed on such an organic layer EL. The second electrode E2 may be disposed to cover the organic layer EL.

Such a second electrode E2 may be formed using a metal such as aluminum (Al), molybdenum (Mo), copper (Cu), or silver (Ag) or an alloy such as molybdenum titanium (MoTi).

In the organic light emitting device OLED according to an aspect of the present disclosure, the first electrode E1 may be an anode electrode, and the second electrode E2 may be a cathode electrode.

A capping layer CPL may be disposed on the second electrode E2 of the organic light emitting device OLED. The capping layer CPL may be disposed to cover the second electrode E2.

The capping layer CPL is a configuration having the role of protecting the second electrode E2 and may be configured as a single layer formed using an organic material, and the present disclosure is not limited thereto.

An encapsulation layer ENCAP may be disposed on the capping layer CPL. The encapsulation layer ENCAP may be disposed to cover the capping layer CPL.

Such an encapsulation layer ENCAP may be composed of an inorganic material such as SiOx or SiNx, and the present disclosure is not limited thereto.

An adhesion layer AF may be disposed on the encapsulation layer ENCAP. The adhesion layer AF may be disposed to cover the encapsulation layer ENCAP.

The adhesion layer AF performs the role of bonding a metal film MF disposed on the adhesion layer AF to the substrate SUB in which the encapsulation layer ENCAP is disposed and can prevent penetration of moisture or a foreign material into the organic light emitting device OLED.

Although a configuration in which the metal film MF is a single layer is illustrated in FIG. 5, the present disclosure is not limited thereto. For example, the metal film MF may include a film containing metal and a film containing an organic material disposed on the film containing metal.

In addition, not only the adhesion layer AF but the capping layer CPL, the encapsulation layer ENCAP, and the metal film MF can achieve the role of preventing penetration of moisture or a foreign material into the organic light emitting device OLED.

On the other hand, the capping layer CPL and the encapsulation layer ENCAP may be disposed in the first and second light emitting areas EA1 and EA2. The capping layer CPL and the encapsulation layer ENCAP may be disposed in a part or the whole of the first non-light emitting area NEA1 depending on the situations. The capping layer CPL and the encapsulation layer ENCAP may not be disposed in the second non-light emitting area NEA2.

Since the capping layer CPL and the encapsulation layer ENCAP are not formed in the second non-light emitting area NEA2 in which a pattern is formed, damage in the capping layer CPL and the encapsulation layer ENCAP capable of preventing penetration of moisture or a foreign material into the organic light emitting device OLED at the time of forming the pattern can be prevented.

The adhesion layer AF and the metal film MF disposed on the encapsulation layer ENCAP may be disposed on the entire surface of the lighting part LA. In other words, the adhesion layer AF and the metal film MF may be disposed in the first and second light emitting areas EA1 and EA2 and the first and second non-light emitting areas NEA1 and NEA2.

To sum up, in the second non-light emitting area NEA2 in which a pattern is formed, a buffer layer BUF, an adhesion layer AF, and a metal film MF may be disposed on the substrate SUB.

In this way, since the auxiliary electrode AE, the organic light emitting device (OLED), the capping layer CPL, and the encapsulation layer ENCAP are not disposed in the second non-light emitting area NEA2, the process of forming a pattern can be simplified.

In other words, when a pattern is formed in an area corresponding to the second non-light emitting area NEA2, there is an effect of easily forming the pattern without concerning damage in the auxiliary electrode AE, the organic light emitting device OLED, the capping layer CPL, and the encapsulation layer ENCAP.

Thereafter, the structure of the pad part PAD and the lighting part LA of the lighting apparatus LD according to an aspect will be reviewed as below with reference to FIG. 6.

Figure 6:
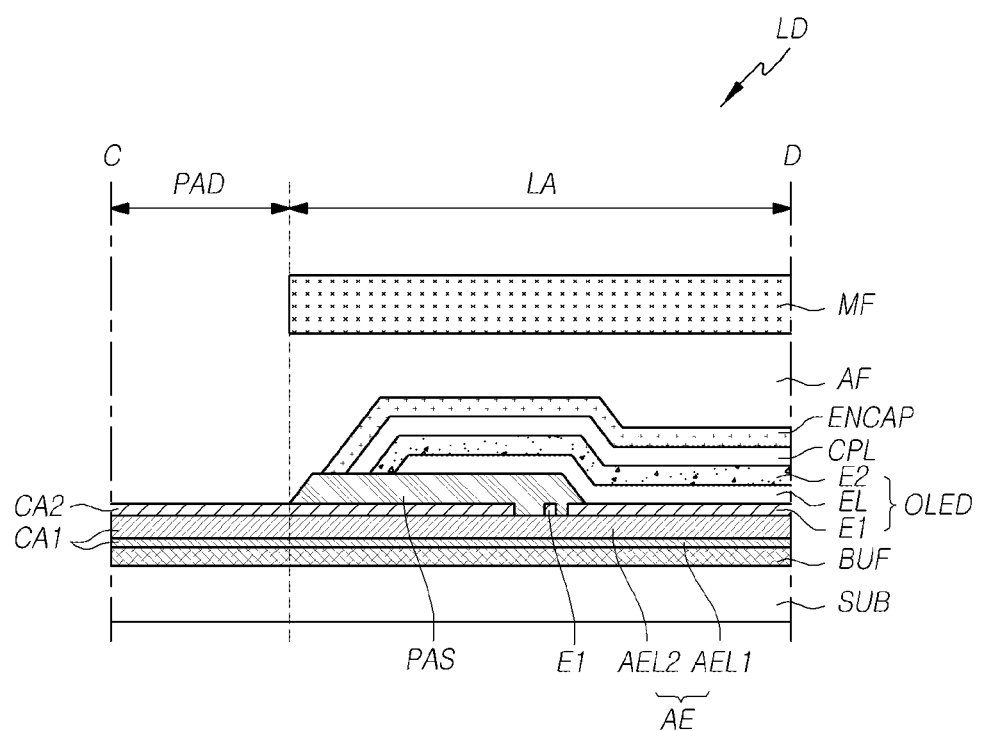
FIG. 6 is a cross-sectional view taken along line C-D illustrated in FIG. 3.

FIG. 6 is a cross-sectional view taken along line C-D illustrated in FIG. 3.

In the following description, details (configurations, effects, and the like) that are the same as those of the aspects described above may be omitted.

Referring to FIG. 6, the lighting apparatus LD according to an aspect of the present disclosure may include a lighting part LA and a pad part PAD.

As illustrated in FIG. 6, a first pad electrode CA1 disposed on a substrate SUB may extend to the lighting part LA. A configuration in which the first pad electrode CA1 is extended may correspond to an auxiliary electrode AE of the lighting part LA.

A second pad electrode CA2 may be disposed on the first pad electrode CA1 disposed in the pad part PAD. The first pad electrode CA1 and the second pad electrode CA2 may be brought into contact with each other and be electrically connected.

The second pad electrode CA2 may extend to the lighting part LA and perform the role of the first electrode E1 of the organic light emitting device OLED.

On the other hand, the organic layer EL, the capping layer CPL, the encapsulation layer ENCAP, the adhesion layer AF, and the metal film MF disposed in the lighting part OLED may not be disposed in the pad part PAD. Through such a structure, the pad electrodes CA1 and CA2 disposed in the pad part PAD may be electrically connected to the outside.

In FIG. 6, although a configuration in which the insulating film INS and the second electrode E2 of the organic light emitting device OLED are not disposed in the pad part PAD is illustrated, the present disclosure is not limited thereto.

For example, the insulating film INS may be disposed on the second pad electrode CA2, and another pad electrode (for example, the third pad electrode CA3 illustrated in FIG. 3) extending from the second electrode E2 of the organic light emitting device OLED may be disposed on the insulating film INS. However, in such a case, the second pad electrode CA2 and the third pad electrode CA3 extending from the second electrode E2 may be disposed to be electrically separate from each other.

Meanwhile, the substrate SUB of the lighting apparatus LD according to an aspect of the present disclosure may contain a material having flexibility. Through this, the flexibility of the substrate SUB can be improved.

In addition, by including a plurality of patterns in the lighting part LA, the lighting apparatus LD can be stretched or contracted by applying an external force to the lighting apparatus LD.

This will be reviewed as below with reference to FIG. 7.

Figure 7:
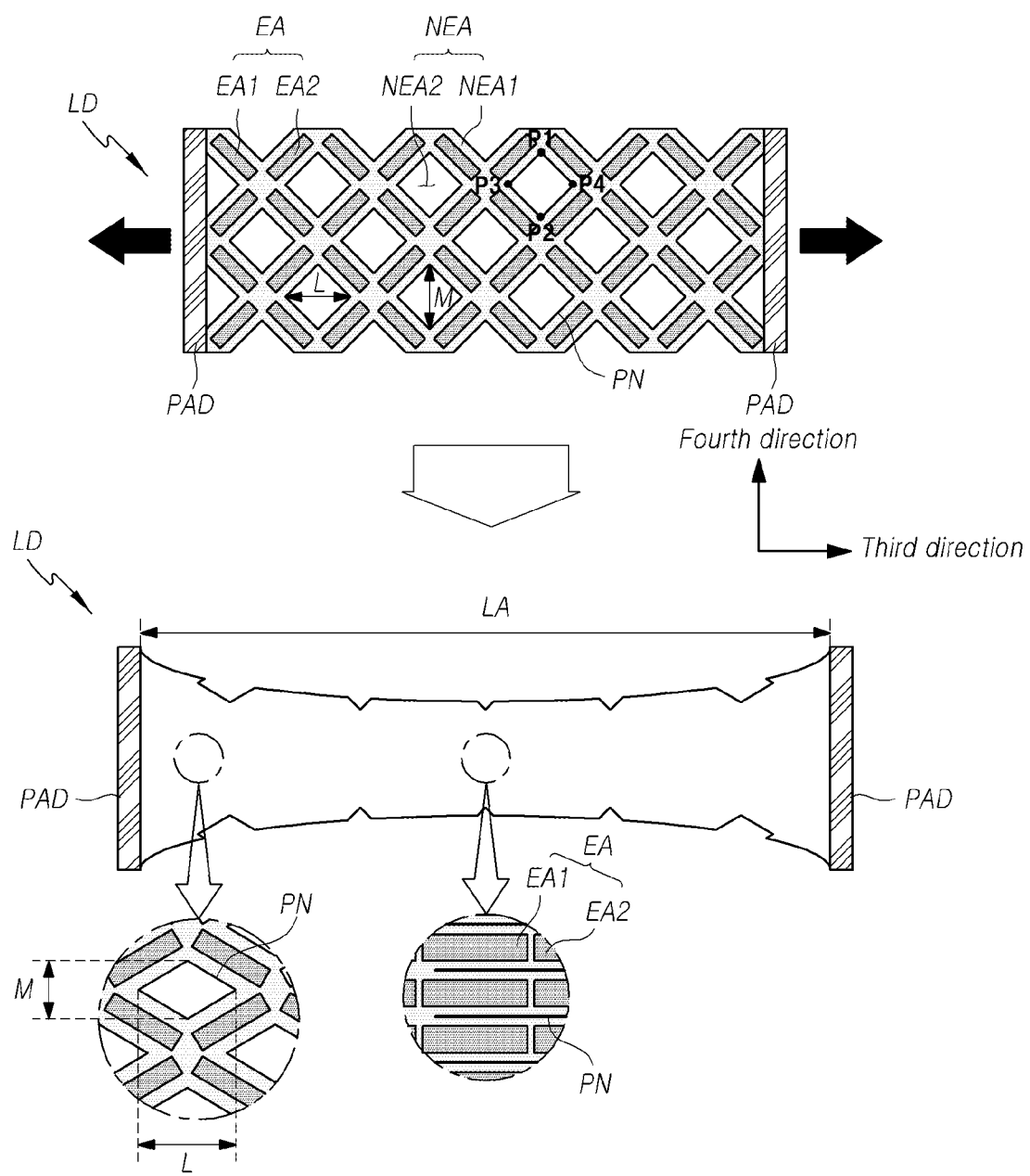
FIG. 7 is a diagram illustrating a stretchable characteristic of a lighting apparatus according to an aspect of the present disclosure.

FIG. 7 is a diagram illustrating a stretchable characteristic of a lighting apparatus according to an aspect of the present disclosure.

Referring to FIG. 7, when a force pulling in a predetermined direction is applied to the lighting apparatus LD of the present disclosure, the lighting apparatus LD can be stretched in a direction in which the force is applied.

Hereinafter, a configuration in which patterns PN of the lighting apparatus according to an aspect of the present disclosure, as illustrated in FIG. 7, are holes, and the shape of each hole is a rectangular shape will be focused in description.

When a pulling force is applied to the lighting apparatus LD in the third direction, the lighting part LA can be stretched while a first part P1 and a second part P2 of each pattern PN among a plurality of patterns PN included in the lighting part LA are brought into contact with each other.

At this time, a length by which the lighting apparatus LA can be maximally stretched may correspond to a sum of first widths (L) of the plurality of patterns PN. Here, the first width L of the pattern PN may be a maximum length of the pattern PN with reference to the same direction as that of the force applied to the lighting apparatus LD.

On the other hand, in a case in which a force for stretching the lighting apparatus LD is applied in a fourth direction that is a direction intersecting with the third direction, the entire lighting part LA can be stretched while third parts P3 and fourth parts P4 of the plurality of patterns PN are brought into contact with each other.

At this time, a length by which the lighting part LA can be maximally stretched may be a sum of second widths M that are widths of the patterns PN with reference to a direction perpendicular to the first width L of the pattern PN. In other words, a length by which the lighting part LA can be maximally stretched may correspond to a sum of second widths of the patterns PN disposed in the lighting part.

The degree of stretching can be adjusted through the magnitude of a force applied to the lighting apparatus LD, the direction of the force, and the like.

In a case in which the magnitude of the force applied to the lighting apparatus LD is small, as illustrated in FIG. 7, the degree of stretching may be different for each area of the lighting part LA of the lighting apparatus LD.

For example, in a case in which a force for pulling in the third direction is applied to the lighting apparatus LD, there may be a part area of the lighting part LA in which some of the plurality of patterns PN are maximally stretched with the first part P1 and the second part P2 brought into contact with each other. In other words, in at least one of the plurality of patterns PN, a width in a direction perpendicular to the force applied to the lighting apparatus LD may be zero.

Together with this, in the remaining part of the plurality of patterns PN, there may be an area in which a distance between the first part P1 and the second part P2 becomes shorter than that before the application of the force to the lighting apparatus LD. In such areas, the first widths L of a plurality of patterns PN may increase more than that before the application of the force to the lighting apparatus LD, and the second widths M of a plurality of patterns PN may decrease more than that before the application of the force to the lighting apparatus LD.

While a case in which a pulling force is applied to the lighting apparatus LD has been described with reference to FIG. 7 as an example, external forces in various directions may be applied to the lighting apparatus LD according to an aspect of the present disclosure, and the lighting apparatus LD may be transformed in the direction of an external force applied to the lighting apparatus LD. For example, the size of the lighting apparatus LD may decrease or be twisted in accordance with an external force.

In addition, in a case in which an external force is applied to the lighting apparatus LD according to an aspect of the present disclosure, while the shape of the lighting part LA may be transformed, a plurality of patterns PN are not present in the pad part PAD, and thus, the shape of the pad part PAD may not be transformed.

In this way, in the lighting apparatus LD according to an aspect of the present disclosure, by disposing a plurality of patterns PN in the non-light emitting area NEA, there is an effect of variously transforming the shape of the lighting part LA.

In FIGS. 1 to 7, although a configuration in which the sizes, the positions, the shapes, and the like of all the patterns PN disposed in the non-light emitting area NEA correspond to each other has been illustrated, the present disclosure is not limited thereto.

Figure 8:
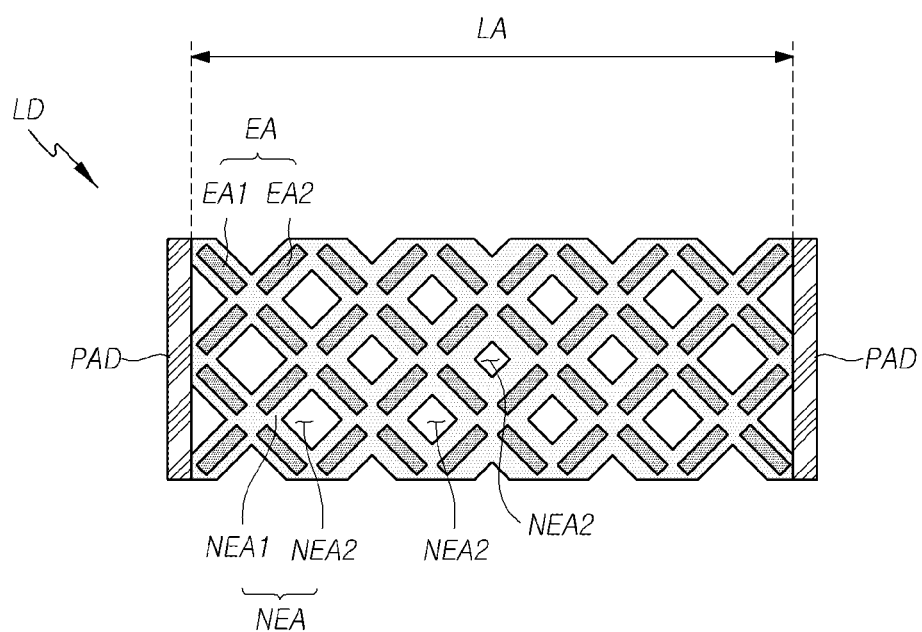
FIGS. 8 to 10 are diagrams illustrating lighting apparatuses according to other aspects of the present disclosure.
Figure 9:
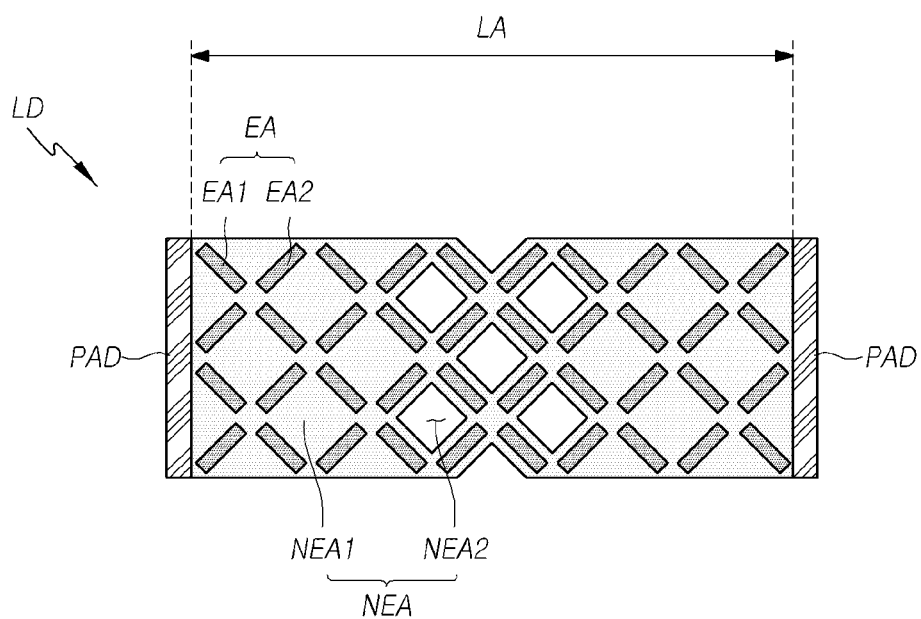
Figure 10:
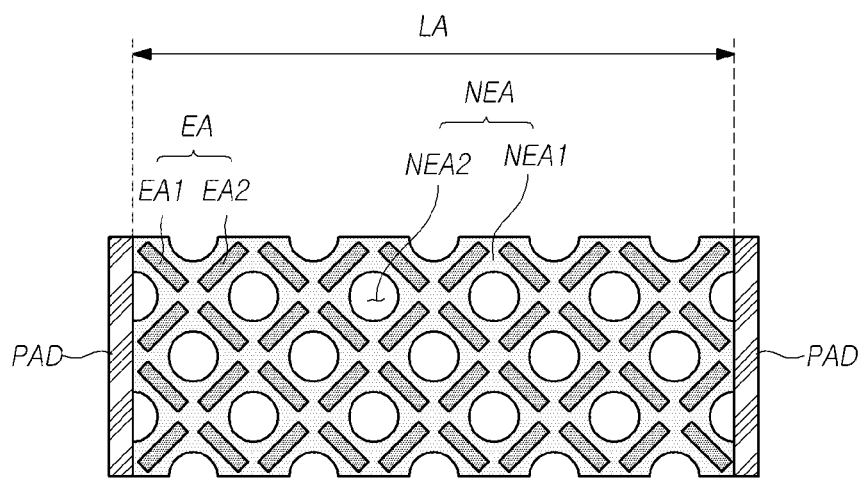

FIGS. 8 to 10 are diagrams illustrating lighting apparatuses according to other aspects of the present disclosure.

First, referring to FIG. 8, the sizes of at least two patterns PN among a plurality of patterns PN disposed in a lighting part LA of the lighting apparatus LD may be different from each other.

For example, as illustrated in FIG. 8, the sizes of patterns PN may gradually increase from the center portion of the lighting part LA toward the pad part PAD.

Also in a case in which an external force applied to the lighting apparatus LD is concentrated on the center portion of the lighting part LA, the sizes of patterns PN disposed in the center portion are smaller than the sizes of patterns PN disposed on the outer side of the center portion, and accordingly, a phenomenon that the center portion is transformed more than the other areas can be prevented.

In another aspect, also in a case in which an external force applied to the lighting apparatus LD is concentrated on the center portion of the lighting part LA, areas of the lighting part LA can be uniformly transformed.

Of course, it is feasible that the sizes of patterns PN may gradually decrease from the center portion of the lighting part LA toward the pad part PAD.

In addition, as illustrated in FIG. 9, a plurality of patterns PN may be disposed only in a part area of the lighting part LA.

Through this, an effect of being capable of transforming the shape of only a desired area can be acquired.

Of course, it is feasible that the plurality of patterns are distributed more densely in the center portion of the lighting part LA than the outer side of the center portion.

In addition, as illustrated in FIG. 10, the shape of a plurality of patterns PN may be a circular shape.

However, the present disclosure is not limited thereto, and a plurality of patterns PN may be in various forms such as a linear shape, a circular shape, an oval shape, a polygonal shape, and the like. In addition, in the present disclosure, patterns PN of various shapes may be disposed in the lighting part LA in a composite manner.

A process of forming such a plurality of patterns PN will be reviewed as below with reference to FIGS. 11 to 13.

Figure 11:
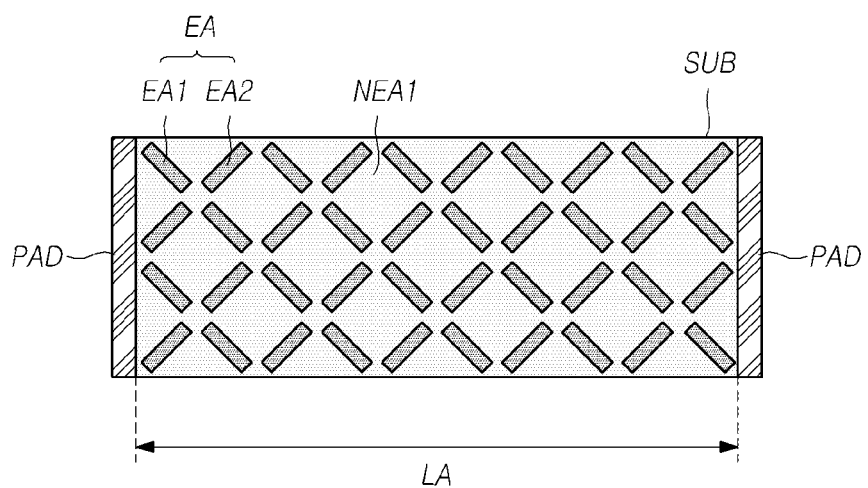
FIGS. 11 to 13 are diagrams illustrating a process of forming a plurality of patterns of lighting apparatuses according to aspects of the present disclosure.
Figure 12:
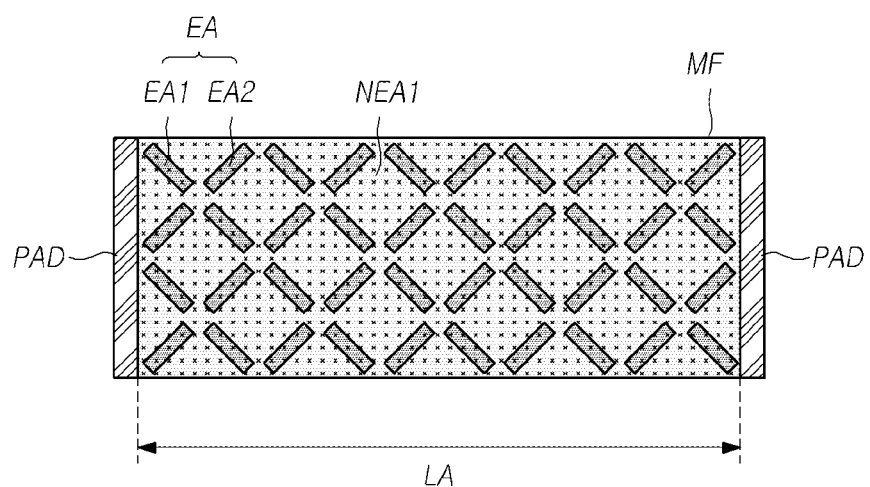
Figure 13:
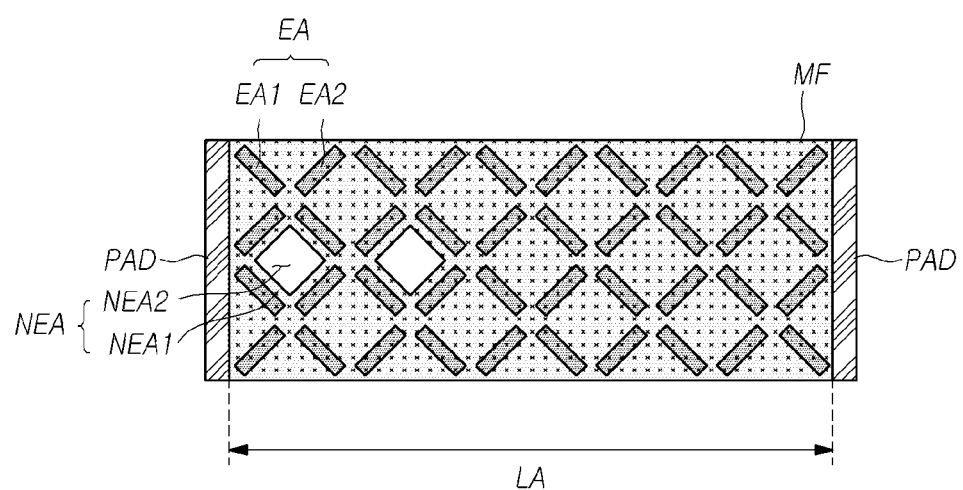

FIGS. 11 to 13 are diagrams illustrating a process of forming a plurality of patterns of lighting apparatuses according to aspects of the present disclosure.

First, referring to FIG. 11, auxiliary electrodes AE, an insulating film INS, and organic light emitting devices OLED are formed on a lighting part LA of a substrate SUB.

Meanwhile, pad electrodes CA1, CA2, and CA3 of pad parts PAD can be simultaneously formed in the process of forming the auxiliary electrodes AE, first electrodes E1 and second electrodes E2 of the organic light emitting devices OLED of the lighting part LA.

Thereafter, as illustrated in FIG. 12, a capping layer CPL, an encapsulation layer ENCAP, an adhesion layer AF, and a metal film MF are sequentially formed in the lighting part LA.

Thereafter, as illustrated in FIG. 13, a plurality of pattern PN are formed in an area not overlapping with a light emitting area EA. The plurality of patterns PN may be formed in a non-light emitting area NEA. More specifically, the plurality of patterns PN may be formed in a second non-light emitting area NEA2.

The plurality of patterns PN may be formed by integrally punching the substrate SUB, the adhesion layer AF, and the metal film MF disposed in the second non-light emitting area NEA.

In this way, the process of forming a plurality of patterns PN of the lighting apparatus LD according to an aspect of the present disclosure can be simple.

According to the aspects of the present disclosure described above, a lighting apparatus having an extendable/contractible structure can be provided.

According to aspects of the present disclosure, a lighting apparatus having a structure capable of acquiring a short reduction effect can be provided.

According to aspects of the present disclosure, a lighting apparatus having a structure capable of having a long life can be provided.

According to aspects of the present disclosure, a lighting apparatus having a stretchable structure can be provided using a simple process.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the aspects disclosed in the present disclosure are intended to illustrate the scope of the technical idea of the present disclosure, and the scope of the present disclosure is not limited by the aspect. The scope of the present disclosure shall be construed on the basis of the accompanying claims in such a manner that all of the technical ideas included within the scope equivalent to the claims belong to the present disclosure.

What is claimed is:

1. A lighting apparatus comprising a lighting part that includes a light emitting area having a plurality of first light emitting areas that are separated apart from each other and a plurality of second light emitting areas separated apart from each other and a non-light emitting area including a first non-light emitting area surrounding the plurality of first light emitting areas and the plurality of second light emitting areas and a plurality of second non-light emitting areas extending from the first non-light emitting area, the lighting apparatus comprising:
   a substrate;
   a plurality of first electrodes disposed on the substrate in the light emitting area;
   an organic layer disposed on the plurality of first electrodes;
   a second electrode disposed on the organic layer; and
   an encapsulation part disposed on the second electrode;
   wherein the plurality of first light emitting areas are arranged in a first direction, and the plurality of second light emitting areas are arranged in a second direction intersecting with the first direction, wherein each of the plurality of second non-light emitting areas corresponds to an area in which a plurality of patterns are included, wherein at least two of the plurality of second non-light emitting areas have different sizes, wherein the sizes of the plurality of patterns gradually increase or decreases from a center portion of the lighting part toward an outer side of the center portion; and wherein the plurality of patterns is distributed more densely in the center portion of the lighting part than the outer side of the center portion.

2. The lighting apparatus according to claim 1, further comprising:

a plurality of auxiliary electrodes disposed on the substrate in the light emitting area and the first non-light emitting area, the plurality of first electrodes overlapping and connecting with the plurality of auxiliary electrodes; and an insulating film overlapping a part of the plurality of first electrodes.

3. The lighting apparatus according to claim 1, wherein each of the plurality of first light emitting areas and the plurality of second light emitting areas includes a plurality of unitary light emitting parts.

4. The lighting apparatus according to claim 3, wherein each of the plurality of unitary light emitting parts includes one first electrode among the plurality of first electrodes, the organic layer disposed on and in contact with the one first electrode, and the second electrode disposed on the organic layer.

5. The lighting apparatus according to claim 3, further comprising a third non-light emitting area disposed between one unitary light emitting part and another unitary light emitting part adjacent to the one unitary light emitting part in each of the plurality of first light emitting area and the plurality of second light emitting areas.

6. The lighting apparatus according to claim 5, wherein the third non-light emitting area corresponds to an area in which an insulating film is disposed.

7. The lighting apparatus according to claim 6, wherein the insulating film is disposed in the plurality of first light emitting areas, the plurality of second light emitting areas, and the first non-light emitting area and is disposed in the third non-light emitting areas of the plurality of first light emitting areas and the plurality of second light emitting areas.

8. The lighting apparatus according to claim 1, wherein the plurality of second non-light emitting areas are separated apart from each other.

9. The lighting apparatus according to claim 1, wherein each of the plurality of patterns includes a hole.

10. The lighting apparatus according to claim 1, wherein, a width of at least one of the plurality of patterns in a direction perpendicular to a force applied to the lighting apparatus is zero when the lighting apparatus is extended.

11. The lighting apparatus according to claim 1, wherein a maximum value of a length by which the lighting apparatus extends corresponds to a sum of widths of the plurality of patterns when the lighting apparatus is extended.

12. The lighting apparatus according to claim 2, wherein the plurality of auxiliary electrodes include at least one opening formed by arranging a plurality of first auxiliary electrodes extending in the first direction and a plurality of second auxiliary electrodes extending in the second direction.

13. The lighting apparatus according to claim 12, wherein a part of one of the plurality of first electrodes is disposed inside the opening of the plurality of auxiliary electrodes, and the first electrode includes an area that is in contact with the plurality of auxiliary electrodes.

14. The lighting apparatus according to claim 13, wherein a part area of the at least one opening corresponds to a unitary light emitting part.

15. The lighting apparatus according to claim 1, wherein the substrate is a flexible substrate.

16. The lighting apparatus according to claim 2, wherein an electric resistance of the plurality of first electrodes is higher than that of the plurality of auxiliary electrodes.

17. The lighting apparatus according to claim 1, further comprising a pad part disposed on an outer side of the lighting part for applying signals to the lighting part.

18. The lighting apparatus according to claim 1 wherein the plurality of patterns is distributed more densely in a center portion of the lighting part than an outer side of the center portion.

19. The lighting apparatus according to claim 17, further comprising:

a plurality of auxiliary electrodes disposed on the substrate in the light emitting area and the first non-light emitting area, the plurality of first electrodes overlapping and connecting with the plurality of auxiliary electrodes in the light emitting area; and an insulating film overlapping a part of the first electrodes.

20. The lighting apparatus according to claim 19, wherein the pad part comprises a first pad electrode extending from the auxiliary electrode, and a second pad electrode extending from the first electrode and connected with the first pad electrode.

21. The lighting apparatus according to claim 20, wherein the pad part further comprises a third pad electrode extending from the second electrode and connected with the first pad electrode.

* * * * *